(12) United States Patent
Xia et al.

(10) Patent No.: US 12,040,339 B2
(45) Date of Patent: Jul. 16, 2024

(54) METHOD FOR MANUFACTURING DEEP TRENCH ISOLATION GRID STRUCTURE

(71) Applicant: Shanghai Huali Microelectronics Corporation, Shanghai (CN)

(72) Inventors: Xiaofeng Xia, Shanghai (CN); Xiang Peng, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 408 days.

(21) Appl. No.: 17/385,430

(22) Filed: Jul. 26, 2021

(65) Prior Publication Data

US 2022/0037381 A1 Feb. 3, 2022

(30) Foreign Application Priority Data

Jul. 29, 2020 (CN) .......................... 202010745346.X

(51) Int. Cl.
*H01L 27/146* (2006.01)
*H01L 23/544* (2006.01)

(52) U.S. Cl.
CPC ........ *H01L 27/1463* (2013.01); *H01L 23/544* (2013.01); *H01L 27/14632* (2013.01); *H01L 27/14687* (2013.01); *H01L 2223/54426* (2013.01)

(58) Field of Classification Search
CPC ......... H01L 27/14632; H01L 27/14687; H01L 27/1463
See application file for complete search history.

(56) References Cited

U.S. PATENT DOCUMENTS

| | | | | |
|---|---|---|---|---|
| 7,800,192 B2 * | 9/2010 | Venezia | .............. | H01L 27/1464 257/292 |
| 9,608,026 B2 * | 3/2017 | Park | .................. | H01L 27/14645 |
| 2015/0263060 A1 * | 9/2015 | Park | .................. | H01L 27/14636 257/432 |
| 2016/0099278 A1 * | 4/2016 | Guyader | ............. | H01L 27/1203 257/432 |

(Continued)

FOREIGN PATENT DOCUMENTS

| | | | | |
|---|---|---|---|---|
| FR | 3026891 A1 * | 4/2016 | ......... | H01L 27/1203 |
| GB | 2547150 A * | 8/2017 | ......... | H01L 27/1462 |

*Primary Examiner* — Mounir S Amer
*Assistant Examiner* — Alexander Belousov
(74) *Attorney, Agent, or Firm* — Banner & Witcoff, Ltd.

(57) ABSTRACT

The present disclosure provides a CMOS image sensor and a pixel structure thereof, and a method for manufacturing a deep trench isolation grid structure in the pixel structure. The method for manufacturing the deep trench isolation grid structure comprises: depositing a first isolation layer and a second isolation layer sequentially on the side walls and bottom surface of each deep trench; and depositing a third isolation layer that fills each deep trench on the upper surface of the second isolation layer, so that the first isolation layer, the second isolation layer and the third isolation layer in the plurality of deep trenches constitute the grid. The deep trench isolation grid structure formed by the method can effectively reduce electrical crosstalk between adjacent grid lines, thereby improving the device performance of the CMOS image sensor which is built upon the deep trench isolation grid structure and the pixel structure thereof.

15 Claims, 10 Drawing Sheets

(56) References Cited

U.S. PATENT DOCUMENTS

| | | | |
|---|---|---|---|
| 2016/0111463 A1* | 4/2016 | Borthakur | H01L 27/1462 |
| | | | 348/294 |
| 2016/0276386 A1* | 9/2016 | Hsu | H01L 27/14627 |
| 2017/0133414 A1* | 5/2017 | Chiang | H01L 27/14689 |
| 2022/0037381 A1* | 2/2022 | Xia | H01L 27/1463 |
| 2022/0199658 A1* | 6/2022 | Lee | H01L 27/1463 |
| 2023/0091032 A1* | 3/2023 | Peng | H01L 27/1464 |
| | | | 257/72 |

* cited by examiner

METHOD FOR MANUFACTURING DEEP TRENCH ISOLATION GRID STRUCTURE

CROSS-REFERENCES TO RELATED APPLICATIONS

This application claims the priority to Chinese patent application No. CN202010745346.X, filed on Jul. 29, 2020 and entitled "METHOD FOR MANUFACTURING DEEP TRENCH ISOLATION GRID STRUCTURE", the disclosure of which is incorporated herein by reference in entirety.

TECHNICAL FIELD

The present disclosure relates to the field of semiconductor devices and manufacturing thereof, in particular, to a CMOS image sensor (CIS) and a pixel structure thereof, and a method for manufacturing a deep trench isolation grid structure therein.

BACKGROUND

In the field of semiconductor technology, an ultra-thin stacked CMOS image sensor (UTS CIS) is formed by bonding together a logic wafer and a pixel wafer that are separately manufactured. Since the logic wafer and the pixel wafer are separately made, the manufacturing process may be flexible and the cost can be low. In addition, this process has the advantage that the logic device and the pixel device mostly do not affect each other, which can optimize the performance. A stacked CIS typically includes two wafers: one is the logic wafer, which mainly functions to provide a logical function circuit, a sequential circuit, a storage unit, and the parts of CIS, and the other is a pixel wafer, which mainly functions to provide a pixel unit, a photodiode, and the other parts of CIS.

During the preparation of the pixel wafer, the deep trench isolation (DTI) grid filling is a key process. The existing process fills those deep trenches with a high dielectric-constant film and a silicon oxide film to form deep trench isolations between adjacent photosensitive elements. Since the pixel wafer includes an array of photosensitive elements, the formed deep trench isolations become the array's grids.

Currently, the high dielectric-constant film and silicon oxide film meet the requirement of isolation, because interfacial charges captured by the high dielectric-constant film may form a potential barrier, blocking the electrical crosstalk among adjacent grid lines. Understandably, the signals of electrical crosstalk directly affect the pixel clarity of the image sensor, and the continually reduced size of the semiconductor devices CIS exacerbates the electrical crosstalk.

The size of the semiconductor CIS devices has been continuously reduced. The development of semiconductor devices roughly follows the Moore's law, that is, the number of transistors in dense integrated circuits is doubled every two years. The present semiconductor process is moving towards 20 nm or below. As a reference: a silicon atom is about 0.2 nm in diameter, which means that the distance between two independent components produced by the 20 nm process can only hold about one hundred silicon atoms.

The exacerbation of electrical crosstalk caused by the continually shrinking size of the semiconductor device cannot be relieved by forming deep trench isolations of a high dielectric-constant film and a silicon oxide film as in the current process.

In view of this, to include a deep trench isolation grid and a method manufacturing the grid are urgently needed to further reduce electrical crosstalk between pixels separated by the deep trench isolation grid, thereby providing a basis for improving device performance of a pixel unit and a CMOS image sensor.

BRIEF SUMMARY

A brief summary of one or more embodiments is given below to provide basic understanding of them. This summary is not a detailed overview of all conceived aspects, and is not intended to identify critical or decisive factors of all aspects or to try to define the scope of any or all aspects. The only purpose is to provide some concepts of one or more aspects in a simplified form so as to provide more detailed descriptions later.

To solve the problem of electrical crosstalk between photosensitive elements of a CMOS image sensor from the continually reduced size of the semiconductor device in the prior art, one embodiment of the present disclosure provides a method for manufacturing a deep trench isolation grid structure, comprising:
  providing a stack layer, wherein the top of the stack layer is a silicon epitaxial layer;
  forming a plurality of deep trenches in a grid shape in the silicon epitaxial layer;
  depositing a first isolation layer and a second isolation layer sequentially on side walls and a bottom surface of each of the plurality of deep trenches; and
  filling each of the plurality of deep trenches by depositing a third isolation layer on an upper surface of the second isolation layer, wherein the first isolation layer, the second isolation layer and the third isolation layer together constitute the grid.

In an embodiment of the manufacturing method, optionally, the first isolation layer is deposited on an upper surface of the silicon epitaxial layer and the second isolation layer is deposited on the first isolation layer; and
  depositing the third isolation layer further comprises:
  depositing a third isolation material layer that fills each deep trench and covers the second isolation layer formed on the upper surface of the silicon epitaxial layer; and
  etching back the third isolation material layer to retain the third isolation material layer inside each deep trench as the third isolation layer.

In an embodiment of the method, optionally, the etching back comprises a bias etching, wherein
  the third isolation material layer in an open region of each of the plurality of deep trenches at an edge of the grid is retained as the third isolation layer.

In an embodiment of the method, optionally, the method further comprising:
  before forming the plurality of deep trenches, forming an alignment mark for the bias etching on the upper surface of the silicon epitaxial layer, wherein the alignment mark helps with the etching back.

In an embodiment of the method, optionally, the third isolation layer comprises a metal layer; and
  the third isolation layer is connected with an external voltage via the third isolation material layer retained in the open region of each of the plurality of deep trenches at the edge of the grid.

In an embodiment of the method, optionally, the second isolation layer serves as an etch stop layer for the etching back.

In an embodiment of the method, optionally, a thickness of the third isolation material layer on the second isolation layer formed on the upper surface of the silicon epitaxial layer is in a range of 200 to 300 angstroms.

In an embodiment of the method, optionally, the third isolation layer comprises a metal layer; and wherein the method further comprises:

forming a metal lead layer connected to the third isolation layer over the stack layer, so that the third isolation layer is connected with an external voltage.

In an embodiment of the method, optionally, the third isolation layer comprises a metal layer; and wherein the method further comprises:

forming a metal lead layer connected to the third isolation layer over the stack layer, so that the third isolation layer is connected with an external voltage.

In an embodiment of the method, optionally, depositing the third isolation layer comprises:

depositing a metal pad layer comprising a titanium nitride material on an upper surface of the second isolation layer; and depositing a metal aluminum layer on an upper surface of the metal pad layer.

In an embodiment of the method, optionally, the first isolation layer comprises a high dielectric-constant film.

In an embodiment of the method, optionally, the second isolation layer comprise a silicon oxide film formed by a plasma enhanced atomic layer deposition process.

In an embodiment of the method, optionally, a thickness of the silicon oxide film is in a range of 250 to 270 angstroms.

In an embodiment of the method, optionally, the plurality of deep trenches has a shape of a rectangle or an inverted trapezoid.

In an embodiment of the method, optionally, the stack layer further comprises a photodiode layer under the silicon epitaxial layer.

Another aspect of the present disclosure further provides a pixel structure of a CMOS image sensor, the pixel structure comprises a photodiode and a deep trench isolation grid structure over the photodiode, wherein the deep trench isolation grid structure is manufactured by any of the embodiments of the manufacturing method described above.

Another aspect of the present disclosure further provides a CMOS image sensor, wherein the CMOS image sensor comprises the pixel structure of the CMOS image sensor according to claim 15.

The deep trench isolation grid structure formed by the manufacturing method according to the present disclosure includes multiple isolation layers, which can suppress electrical crosstalk between adjacent photosensitive elements more effectively. Thus, a possibility to effectively improve the device performance of a CMOS image sensor including the deep trench isolation grid structure and a pixel unit thereof is provided. In addition, the process flow of the method for manufacturing the deep trench isolation grid structure according to one aspect of the present disclosure is simple, and can be compatible with the existing process flow, so that the manufacturing method has operability and universality.

BRIEF DESCRIPTION OF THE DRAWINGS

The above features and advantages of the present disclosure can be better understood after reading detailed descriptions of the embodiments of the present disclosure in conjunction with the following drawings. In the drawings, each component is not necessarily drawn to scale, and components having similar related characteristics or features may have the same or similar reference numerals.

FIG. 3B enlarges the deep trench isolation grid structure in FIG. 3A.

FIG. 8B enlarges the deep trench isolation grid structure in FIG. 8A, and FIG. 9B enlarges the deep trench isolation grid structure in FIG. 9A.

Figure 1:
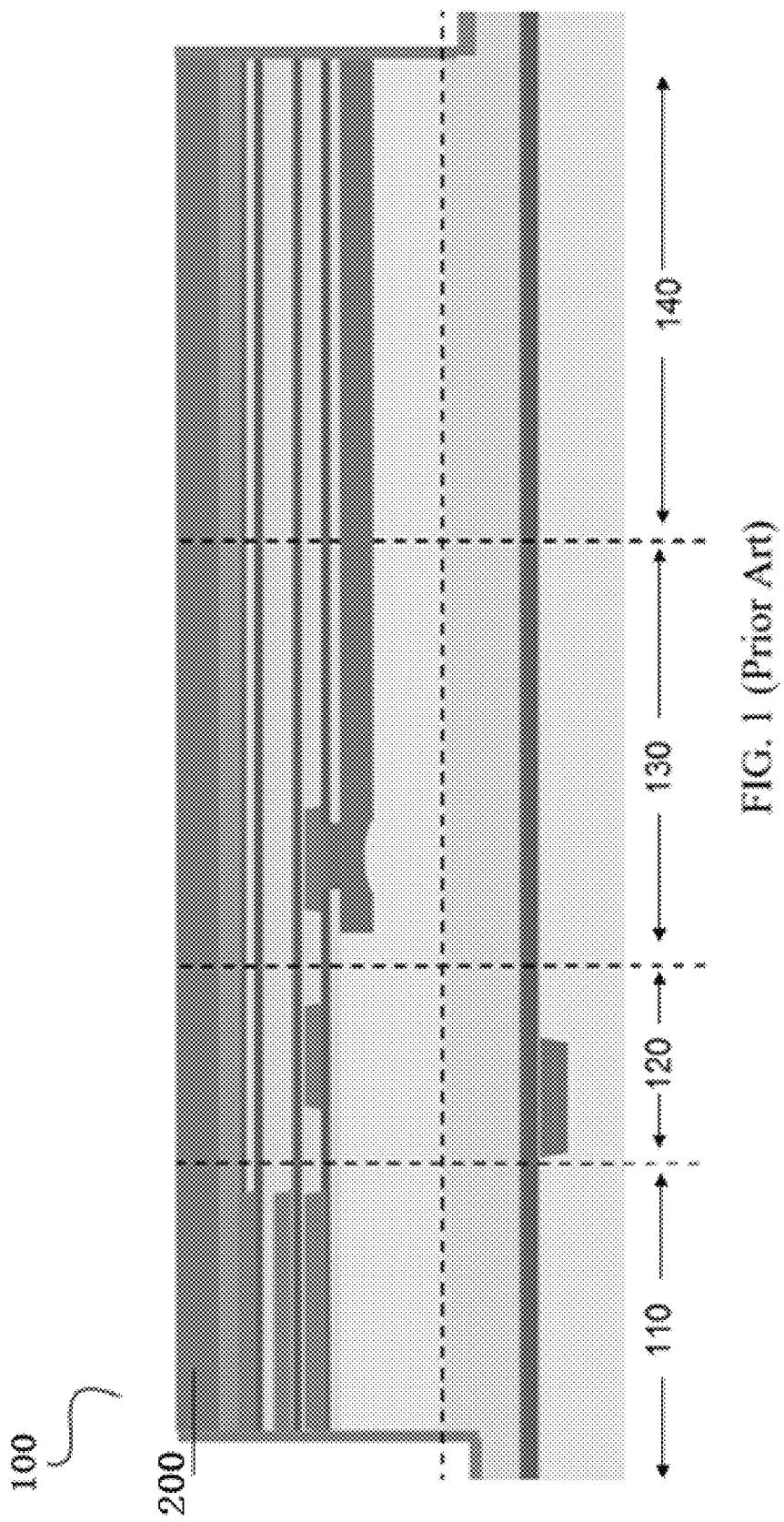
FIGS. 1, 2, 3A, 3B, and 4 illustrate a manufacturing process of forming deep trench isolation grids with the existing techniques.

Reference numbers: Stack layer 100; PAD region 110; UTS region 120; Metal shield region 130; Pixel region 140; Silicon epitaxial layer 200; Deep trench 210; Deep trench isolation grid structure 300, 400; High dielectric constant film 310, 410; Silicon oxide 320, 420; Oxide buffer layer 311, 411; Metal aluminum layer 430, 430; Metal pad layer 431; Metal lead layer 500.

DETAILED DESCRIPTION OF THE DISCLOSURE

The present disclosure relates to a semiconductor process and device. More specifically, an embodiment of the present disclosure provides a method for manufacturing a deep trench isolation grid structure. The deep trench isolation grid structure formed by the manufacturing method provided in the embodiment of the present disclosure can effectively reduce electrical crosstalk between adjacent photosensitive elements, which provides a basis for improving the device performance of a CMOS image sensor and a pixel structure thereof. The present disclosure further provides other embodiments, including a CMOS image sensor and a pixel structure thereof.

The following description is provided so that those skilled in the art can implement and use the present disclosure and combine it into a specific application background. Various modifications, and various uses in different applications will be readily apparent to those skilled in the art, and the general principles defined herein can be applied to a wide range of embodiments. Thus, the present disclosure is not limited to the embodiments given herein, but should be granted in the broadest scope of the principles and novel features disclosed herein.

Many specific details are set forth in the following detailed description to provide a thorough understanding of the present disclosure. However, it would be apparent to those skilled in the art that the practice of the present disclosure is not necessarily limited to these specific details. In other words, the well-known structures and devices are shown in the form of block diagrams without details to avoid obscuring the present disclosure.

Readers should pay attention to all documents and literature that are simultaneously submitted with this description and are open to the public to consult this description, and all such documents and literature are incorporated herein by reference. All features disclosed in this description (including any of the appended claims, abstract, and drawings) can be substituted by alternative features for achieving the same, equivalent or similar purposes, unless otherwise directly stated. Therefore, each feature disclosed is only an example of a group of equivalent or similar features, unless otherwise specified.

It should be noted that, in the case of use, the signs left, right, front, rear, top, bottom, positive, reverse, clockwise and counterclockwise are only used for convenient purposes, but do not imply any specific direction. In fact, they are used to reflect the relative position and/or direction between individual parts of an object.

As mentioned above, in the process of preparing a pixel wafer, deep trench isolation grid filling is a key process. FIGS. 1, 2, 3A, 3B, and 4 show the manufacturing process of forming deep trench isolation grids in the existing process. First, as shown in FIG. 1, a logic wafer and a pixel wafer have been bonded by a bonding process, and the broken line in the horizontal direction of FIG. 1 indicates a bonding interface. After bonding, a stack layer 100 including the logic wafer and the pixel wafer is provided. In the structure shown in FIG. 1, a silicon epitaxial layer 200 having a predetermined thickness has been formed as the top of the stack layer. A person skilled in the art can determine the thickness of the silicon epitaxial layer 200 according to the requirements, and the thickness of the silicon epitaxial layer 200 should not improperly limit the protection scope of the present disclosure.

FIG. 1 shows different regions of the stack layer structures 100 of a CMOS image sensor. The CMOS image sensor is divided into multiple regions, including at least a PAD region 110, a UTS region 120, a metal shield region 130, and a pixel region 140. The PAD region 110 is used for later testing, the UTS region 120 is used to connect the pixel wafer with the logic wafer, the metal shield region 130 is grounded, and the pixel region 140 is the main part of a pixel wafer and is mainly used to collect light. Understandably, these regions are sequentially arranged from left to right in the structure shown in FIG. 1, but in practical applications, the four regions can be arranged in different areas of the wafer as required, and do not necessarily have the cross-sectional structure as shown in FIG. 1.

Figure 2:
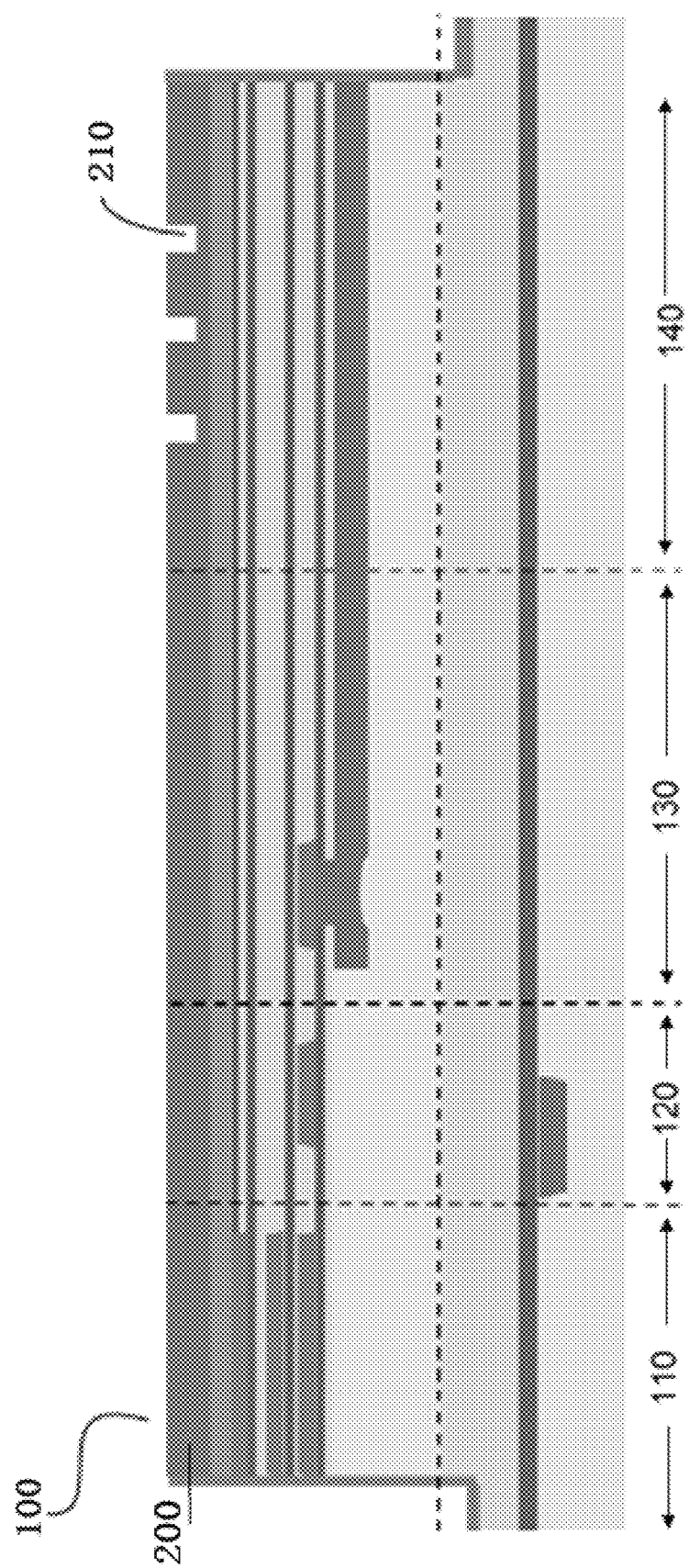

Second, as shown in FIG. 2, deep trenches 210 are formed in the silicon epitaxial layer 200, in order to form deep trench isolation (DTI) in the deep trenches 210. The concept of deep trench isolation is opposite to the concept of shallow trench isolation (STI). The shallow trench isolation is usually formed only on the surface of a dielectric layer, while the deep trenches are deeply formed at the interior of the dielectric layer. In an embodiment, the thickness of the silicon epitaxial layer 200 is 3 μm, while the depth of the deep trench 210 can reach 1.5 μm. Understandably, the deep trenches 210 can be formed according to the existing or future method, and the method for forming the deep trenches 210 should not improperly limit the protection scope of the present disclosure.

In addition, as described above, since the pixel wafer includes a plurality of photosensitive elements in an array, the plurality of deep trenches formed appears as grids from the perspective of a top view.

Third, as shown in FIG. 3A, a high dielectric-constant film 310 and silicon oxide 320 are deposited on the upper surface of the silicon epitaxial layer 200 and in the deep trenches 210 to form deep trench isolation grid structures 300 in the deep trenches 210. FIG. 3B enlarges the deep trench isolation grid structure 300 in a deep trench 210. As shown in FIG. 3B, an oxide buffer layer 311 is further formed between the deep trench 210 and the high dielectric constant film 310. Moreover, in the prior art, the silicon oxide 320 is usually formed by atomic layer deposition.

Figure 4:
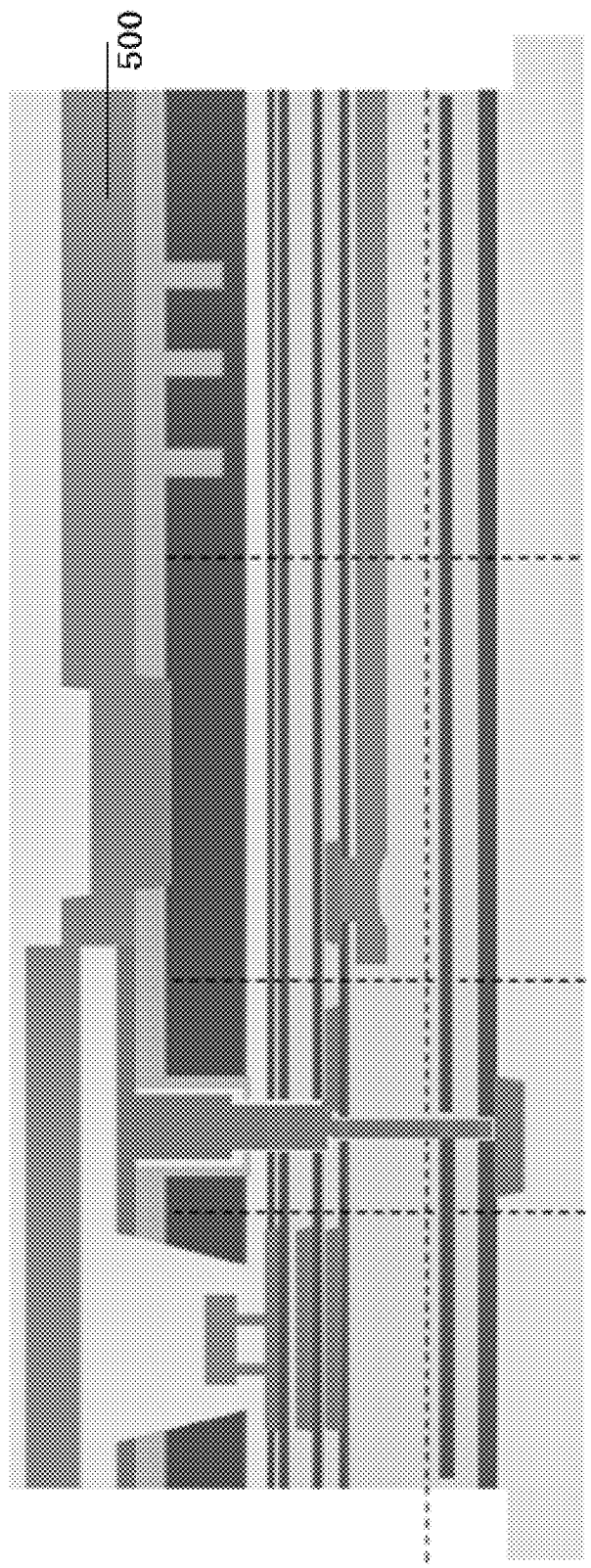

Finally, as shown in FIG. 4, various metal lead layers 500 at the rear segment are formed over the silicon epitaxial layer 200 according to actual requirements after the deep trench isolation grid structures 300 are formed to realize various functions of a CMOS image sensor.

As described above, the deep trench isolation grid structures 300 including the high dielectric constant film 310 and the silicon oxide 320 can achieve the effect of isolation, because interface charges captured by the high dielectric-constant film can form a potential barrier, which can block electrical crosstalk between adjacent photosensitive elements. Understandably, such isolation is a passive formation of a potential barrier. In the case where the electrical crosstalk between the grid lines is continually enhanced due to the continually reduced distance between the grid lines, the effect of blocking the electrical crosstalk between the adjacent photosensitive elements by passively forming the potential barrier is not enough. A method that can block electrical crosstalk between adjacent photosensitive elements more effectively is desired.

Figure 5:
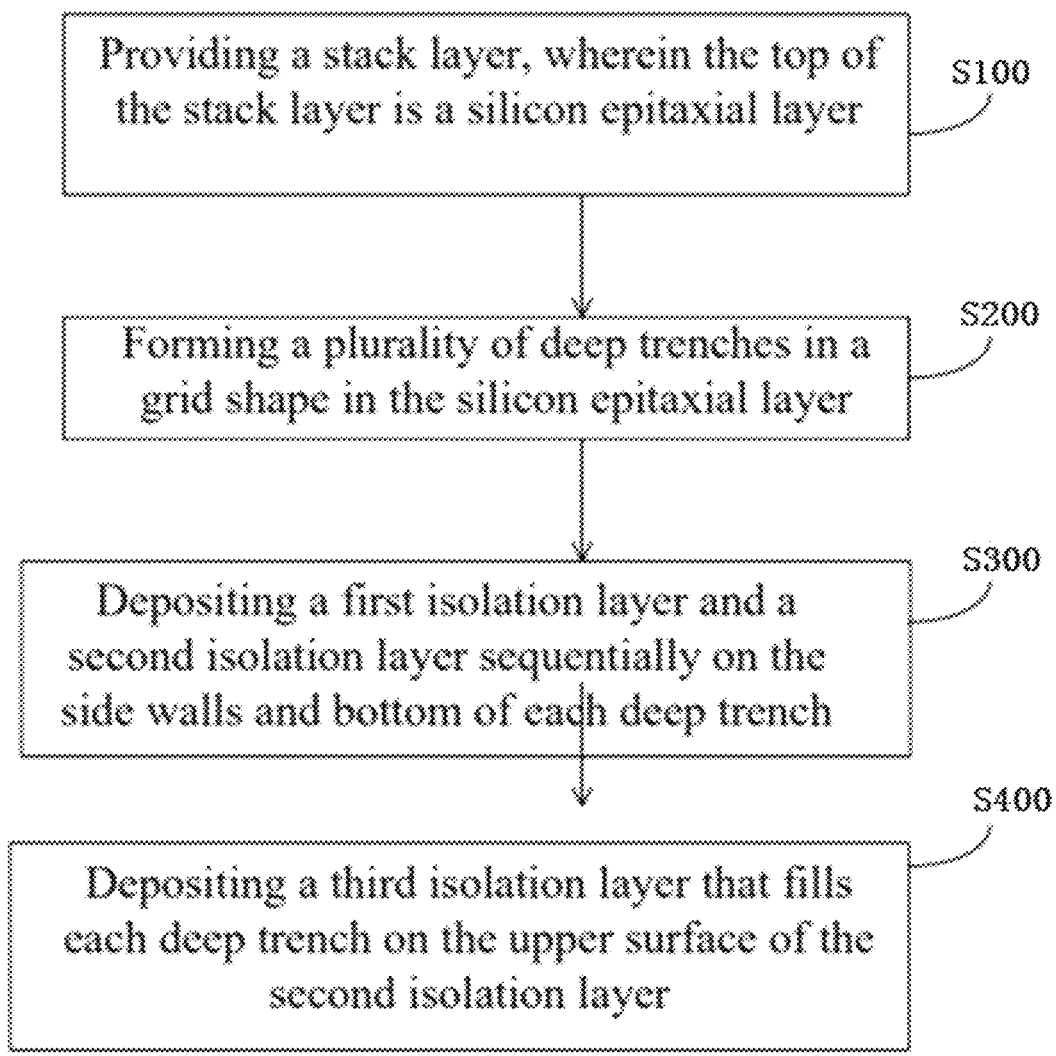
FIG. 5 illustrates a flowchart of a method for manufacturing the deep trench isolation grids according to the present disclosure.

Therefore, the present disclosure provides a method for manufacturing a deep trench isolation grid structure, which can effectively solve the problem of electrical crosstalk between adjacent photosensitive elements in the case where the size of the semiconductor device is continually reduced. The method for manufacturing a deep trench isolation grid structure according to the present disclosure is interpreted with reference to FIG. 5. As shown in FIG. 5, the method for manufacturing a deep trench isolation grid structure according to the present disclosure includes the following steps. Step S100: providing a stack layer, wherein the top of the stack layer is a silicon epitaxial layer; step S200: forming a grid comprising a plurality of deep trenches in the silicon epitaxial layer; step S300: depositing a first isolation layer and a second isolation layer sequentially on the side walls and bottom of each of the deep trenches; and step S400: depositing a third isolation layer that fills each deep trench on the upper surface of the second isolation layer, so that the first isolation layer, the second isolation layer and the third isolation layer in each of the plurality of deep trenches constitute multiple isolation grids.

The implementation of the method for manufacturing a deep trench isolation grid structure according to the present disclosure are better interpreted below in conjunction with FIGS. 6, 7, 8A, 8B, 9A, 9B, and 10.

Figure 6:
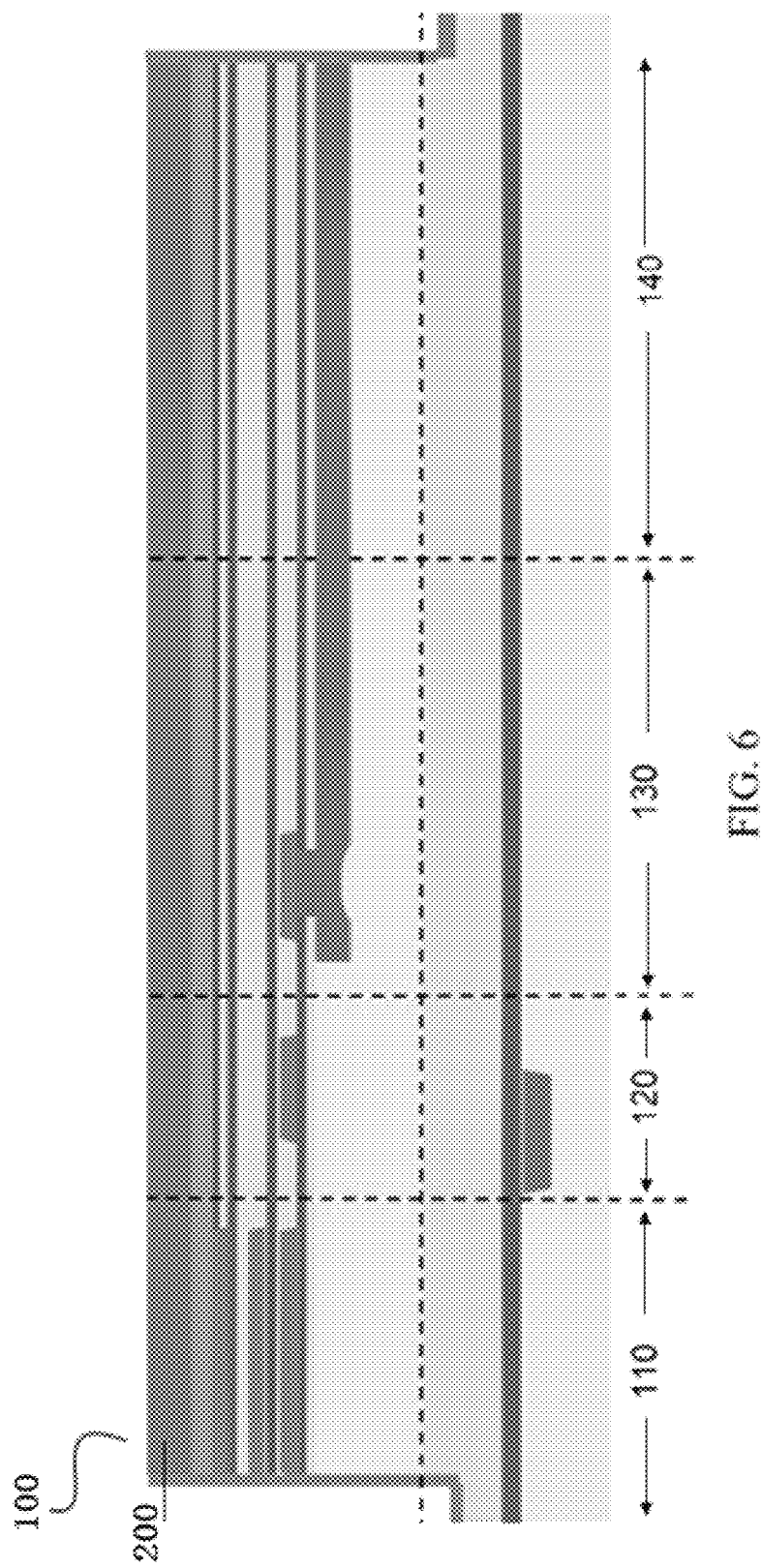
FIGS. 6, 7, 8A, 8B, 9A, 9B, and 10 illustrate the method for manufacturing deep trench isolation grids according to the present disclosure.

First, FIG. 6 shows step S100: providing a stack layer 100, wherein the top of the stack layer is a silicon epitaxial layer 200. As described above, the stack layer 100 includes a logic wafer and a pixel wafer bonded by a bonding process, and the broken line in the horizontal direction of FIG. 6 indicates a bonding interface. The pixel wafer is over the broken line, and the logic wafer is under the broken line.

In the structure shown in FIG. 6, a silicon epitaxial layer 200 having a predetermined thickness has been formed as the top of the stack layer. A person skilled in the art can determine the thickness of the silicon epitaxial layer 200 according to the requirements, and the thickness of the silicon epitaxial layer 200 should not improperly limit the protection scope of the present disclosure.

FIG. 6 shows stack layer structures of different regions of a CMOS image sensor. The CMOS image sensor includes at least a PAD region 110, a UTS region 120, a metal shield region 130, and a pixel region 140. The PAD region 110 is used for later testing, the UTS region 120 is used to connect the pixel wafer with the logic wafer, the metal shield region 130 is grounded, and the pixel region 140 is the main part of a pixel wafer and is mainly used to collect light. Understandably, these regions are sequentially arranged from left to right in the structure shown in FIG. 6, but in practical applications, the four regions can be arranged in different regions of the wafer as required, and do not necessarily have the cross-sectional structure as shown in FIG. 6.

The deep trench isolation grid structure formed by the manufacturing method according to the present disclosure is disposed in the silicon epitaxial layer 200. In an embodiment, the deep trench isolation grid structure provided by the present disclosure is applied in a backside illuminated image sensor. That is, the stack layer 100 further includes a photodiode layer formed under the silicon epitaxial layer.

Figure 7:
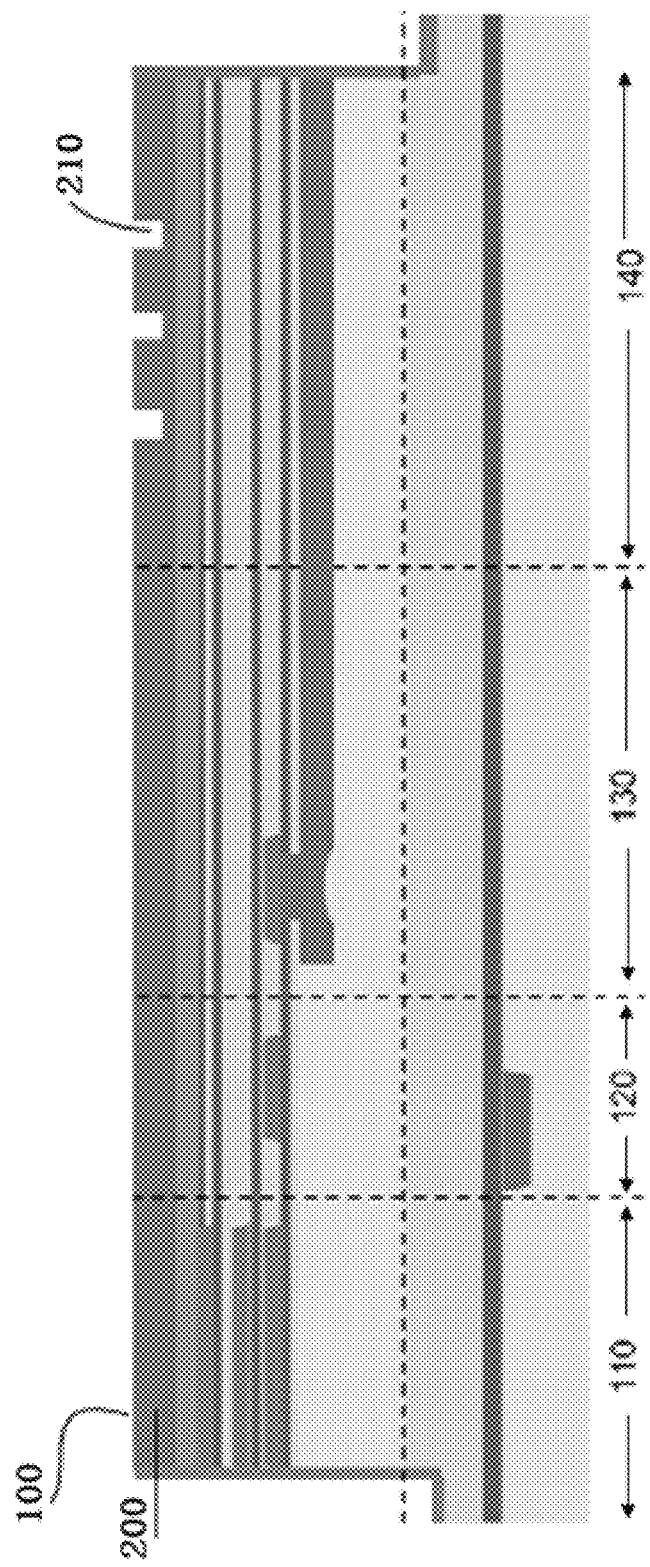

Then, referring to FIG. 7 to understand step S200, as shown in FIG. 7, deep trenches 210 are formed in the silicon epitaxial layer 200, in order to form deep trench isolation (DTI) in the deep trenches 210. The concept of deep trench isolation is opposite to the concept of shallow trench isolation (STI). The shallow trench isolation is usually formed only on the surface of a dielectric layer, while the deep trenches are deeply formed at the interior of the dielectric layer. In an embodiment, the thickness of the silicon epitaxial layer 200 is about 3 μm, while the depth of the deep trench 210 can reach as deep as 1.5 μm. In the manufacturing method provided by the present disclosure, the cross sections of the deep trenches formed are rectangular or inverted trapezoidal, so that an isolation grid structures as large as possible can be formed to effectively eliminate the electrical crosstalk between the adjacent photosensitive elements. Understandably, the deep trenches 210 can be formed according to the existing or future method, and the method for forming the deep trenches 210 should not improperly limit the protection scope of the present disclosure.

In addition, as described above, since the pixel wafer includes a plurality of photosensitive elements in an array, the plurality of deep trenches formed appears as grids from the perspective of a top view.

In an embodiment, before the deep trenches 210 are formed in the silicon epitaxial layer 200, the manufacturing method provided by the present disclosure further includes: adding an etch alignment mask, and forming an alignment mark for subsequent metal bias etch on the upper surface of the silicon epitaxial layer by lithography and etching processes.

The superposition of a photoresist layer etched by the subsequent metal bias etch requires an alignment point. However, the top surface of the stack layer currently treated in the present disclosure is actually the backside of the wafer, that is, the silicon substrate, but the backside of the wafer does not have any alignment marks, so some alignment marks are needed before the photo layer is deposited. The photoresist thickness should satisfy that the etch has sufficient extra depth protection.

Figure 8:
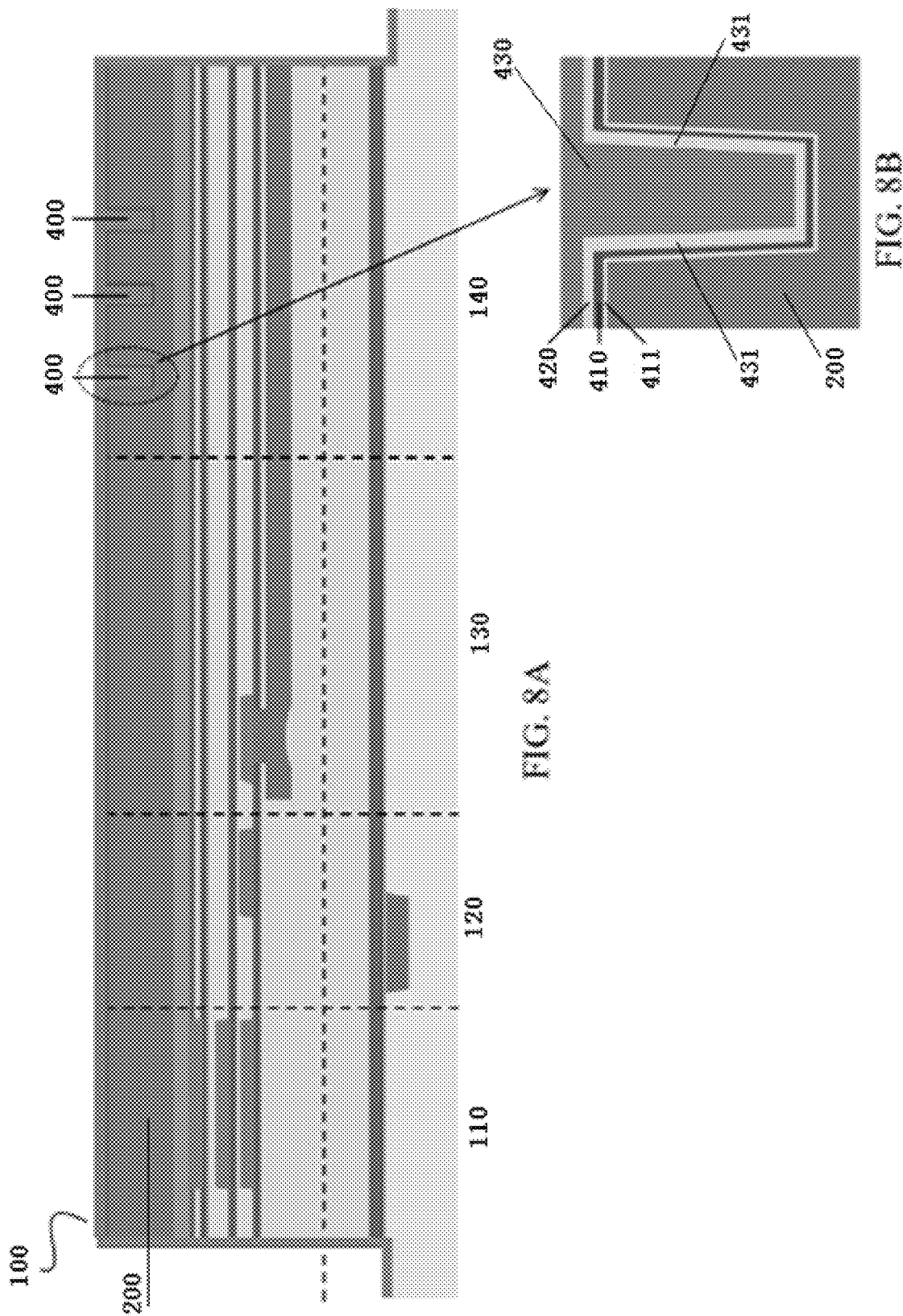

Subsequently, step S300 and step S400 are interpreted in conjunction with FIGS. 8A, 8B, 9A, and 9B. First, refer to FIG. 8A. As shown in FIG. 8A, a high dielectric constant film 410, a silicon oxide layer 420 and a metal aluminum layer 430 are deposited on the upper surface of the silicon epitaxial layer 200 and in the deep trenches 210 to form deep trench isolation grid structures 400 in the deep trenches 210. FIG. 8B enlarges the deep trench isolation grid structure 400 in a deep trench 210 (not shown in FIG. 8B) inside the epitaxial layer 200. As shown in FIG. 8B, an oxide buffer layer 411 is further formed between the surface of the deep trench 210 and the high dielectric-constant film 410, so that the high dielectric-constant film 410 is better formed on the upper surface of the deep trench in the silicon epitaxial layer 200.

As shown in FIG. 8B, in order to better form the metal aluminum layer 430, in a preferred embodiment of the present disclosure, before the metal aluminum layer 430 is formed, a metal pad layer 431 having a tantalum nitride (TaN) material is formed, so that the metal aluminum layer 430 can adhere to the surface of the deep trench 210 more securely and tightly via the metal pad layer 431.

It can be seen from FIG. 8B that the oxide buffer layer 411, the high dielectric constant film 410, the silicon oxide layer 420 and the metal pad layer 431 are all thin film layers, and they are formed on the side walls and bottom surface of the deep trench 210 without filling the deep trench 210. The metal aluminum layer 430 further fills the entire deep trench 210 and also covers the entire silicon epitaxial layer.

In the above embodiment, the film 410 with a high dielectric constant is formed by a physical vapor deposition process or in a diffusion furnace. The silicon oxide layer 420 is formed by a process such as the plasma enhanced atomic layer deposition (PEALD), or CVD, i.e., chemical vapor deposition. The metal pad layer 431 and the metal aluminum layer 430 are formed by physical vapor deposition.

In the above described embodiment, the thickness of the silicon oxide layer 420 formed is about 260±10 angstroms, i.e., in a range of 250-270 angstroms. The thickness of this part of the silicon oxide layer 420 needs to be set probably to ensure that it serves as an etching stop layer to protect the high dielectric-constant film 410 under the silicon oxide layer 420 when the metal layer is etched subsequently. Meanwhile, the silicon oxide layer 420 before etching cannot be too thicker than proper, otherwise, it might fill the deep trench 210 in advance. As a result, the subsequent metal layer fails to fill smoothly.

The thickness of the metal pad layer 431 of the tantalum nitride material (TaN) can be determined according to an existing or a future process standard, and the thickness of the metal pad layer 431 should not improperly limit the protection scope of the present disclosure.

The thickness of the metal aluminum layer 430 covering the silicon epitaxial layer is 200-300 angstroms. Understandably, in order to ensure that the metal aluminum layer 430 can fully fill the deep trench 210, an allowance is required for the deposition of the metal aluminum layer 430. Because the metal aluminum layer formed over the silicon epitaxial layer will be etched off later, the metal aluminum layer covering the silicon epitaxial layer is not desired to be too thick, which can then reduce the subsequent etching amount of the metal aluminum layer on the substrate.

The deep trench isolation grid structure 400 provided by the present disclosure includes multiple isolation structures: a high dielectric constant film 410, a silicon oxide layer 420, and a metal aluminum layer 430. With regard to the multiple isolation structures provided by the present disclosure, the high dielectric constant film and the silicon oxide layer can have a potential barrier formed by passively captured interface charges to block the crosstalk between the adjacent grids. Because of the metal characteristics of the aluminum layer 430, the metal aluminum layer 430 can be actively grounded, and a physical negative voltage is added during later testing, so that a balanced potential barrier is achieved between the adjacent grids to suppress the crosstalk of electrodes in photodiodes. That is, the multiple isolation structures of the present disclosure balance the potential barrier in active and passive forms, which can further improve the effect of suppressing the crosstalk of electrodes in photodiodes.

The metal aluminum layer 430 is desired to be formed inside the deep trench 210, and therefore, step S400 further includes the step of etching back the metal aluminum layer that covers the silicon epitaxial layer. In the embodiment provided by the present disclosure, since the metal aluminum layer 430 needs to be grounded and then connected with an external voltage, lead pins of the metal aluminum layer 430 need to be formed.

In order to simplify the process flow, in the step of etching back the metal aluminum layer, the metal aluminum layer in open regions of the deep trenches at edges of the grids is retained from being etched by means of metal aluminum bias etch, so that this part of metal aluminum layer retained is directly used as the lead pins, which can be directly connected to a metal lead layer subsequently.

Figure 9:
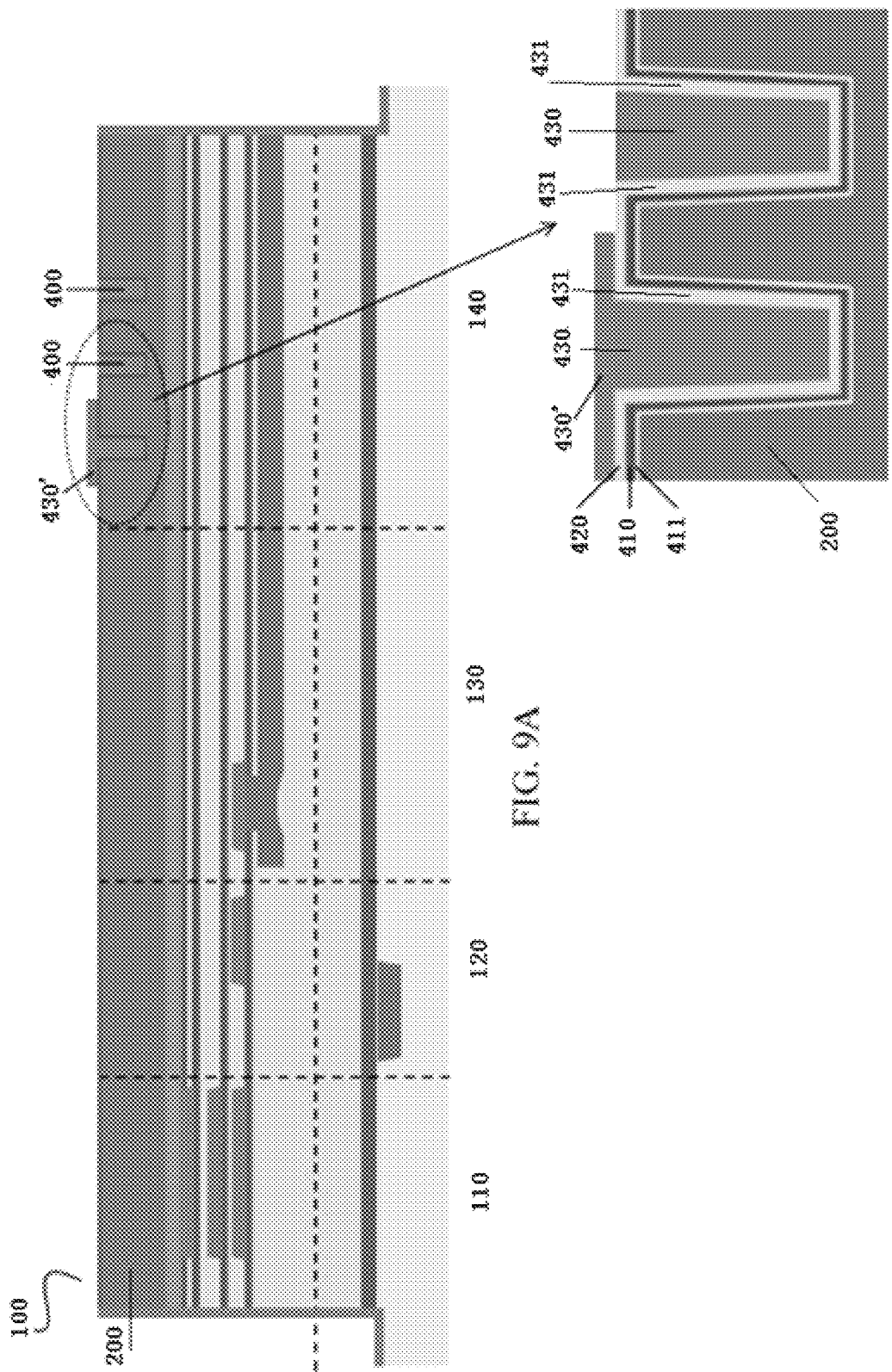

FIG. 9A illustrates a schematic diagram after back etching of the metal aluminum layer 430. FIG. 9B enlarges the deep trench region, especially a film structure of a deep trench region at the edge of a grid. It can be seen that, after the bias etch, the metal aluminum layer 430' above the top surface of the silicon epitaxial layer in the open region of the deep trench at the edge of the grid is retained, and directly forms a pin that can be connected to the subsequent metal lead layer, so that additional processes are not required to form connectors for connecting the metal aluminum layer with the subsequent metal lead layer. Understandably, as described above, the alignment marks formed before the deep trench 210 is formed can be used to implement the bias etch of the metal aluminum layer in this step.

Just because the metal aluminum layer covering the silicon epitaxial layer in the open region of the deep trench at the edge of the grid is directly used as a pin connected to the subsequent metal lead layer, the metal aluminum layer having a thickness in a range of 200-300 angstroms is required to be formed in the previous step during forming the metal aluminum layer, which can also ensure that the metal aluminum layer can be used as a pin.

For the metal aluminum layer in other regions, the silicon oxide layer 420 is used as an etching stop layer, so that the excess metal aluminum layer can be accurately removed. Meanwhile, the silicon oxide layer 420 serves as an etching stop layer, so the high dielectric-constant film 410 under the silicon oxide layer 420 can be well protected, thereby ensuring that the high dielectric-constant film 410 can capture interface charges to form a barrier which blocks the electrical crosstalk over the adjacent grids.

The silicon oxide layer 420 serves as an etching stop layer and a protective layer for the high dielectric-constant film 410, thus a silicon oxide layer having a thickness at about 260±10 angstroms is required to be formed in the previous step during forming the silicon oxide layer, thereby ensuring that the back etch of the metal aluminum layer can stop at the silicon oxide layer, because the silicon oxide layer has enough thickness to serve as a protective layer of the high dielectric-constant film 410.

Figure 3:
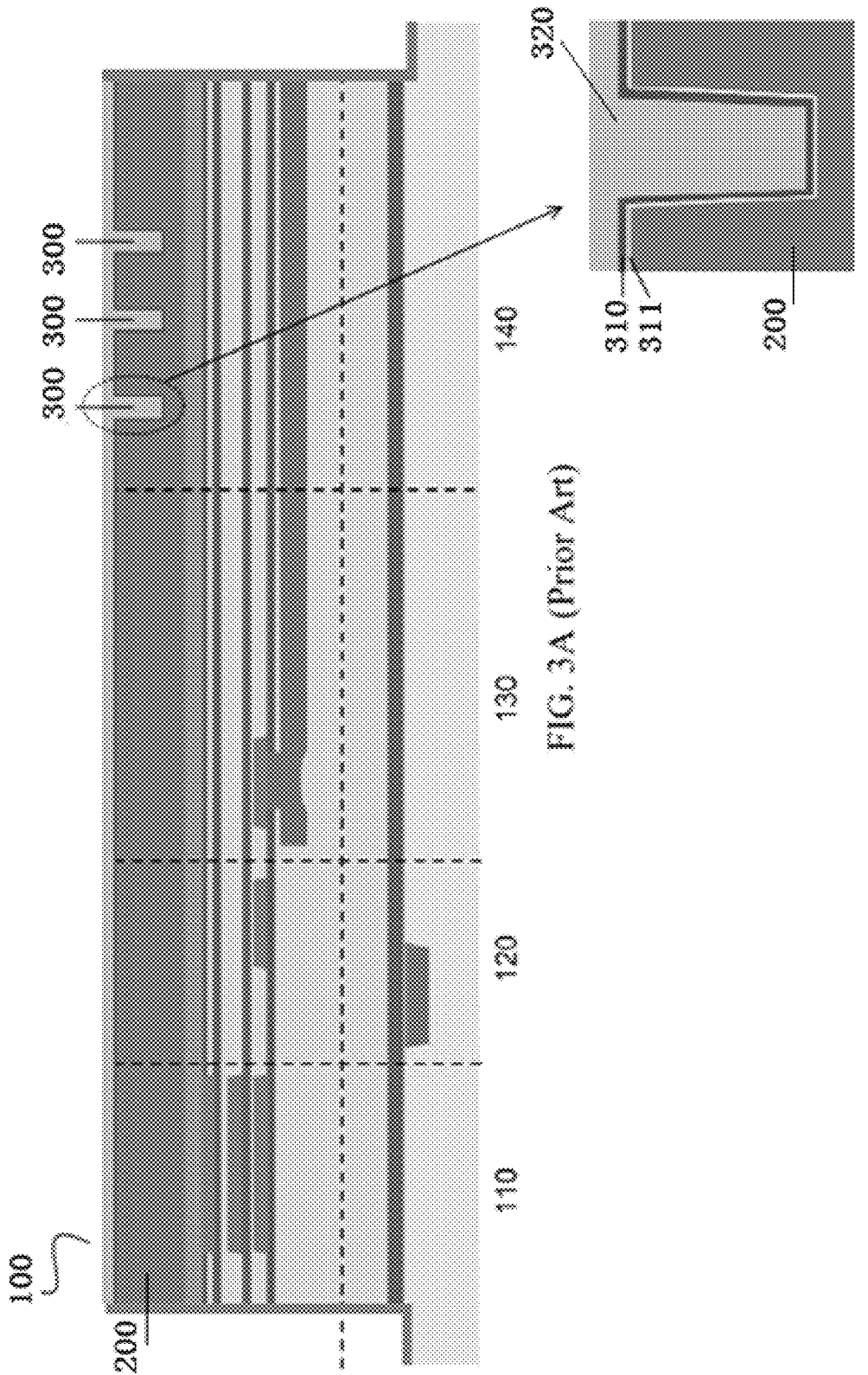
Figure 10:
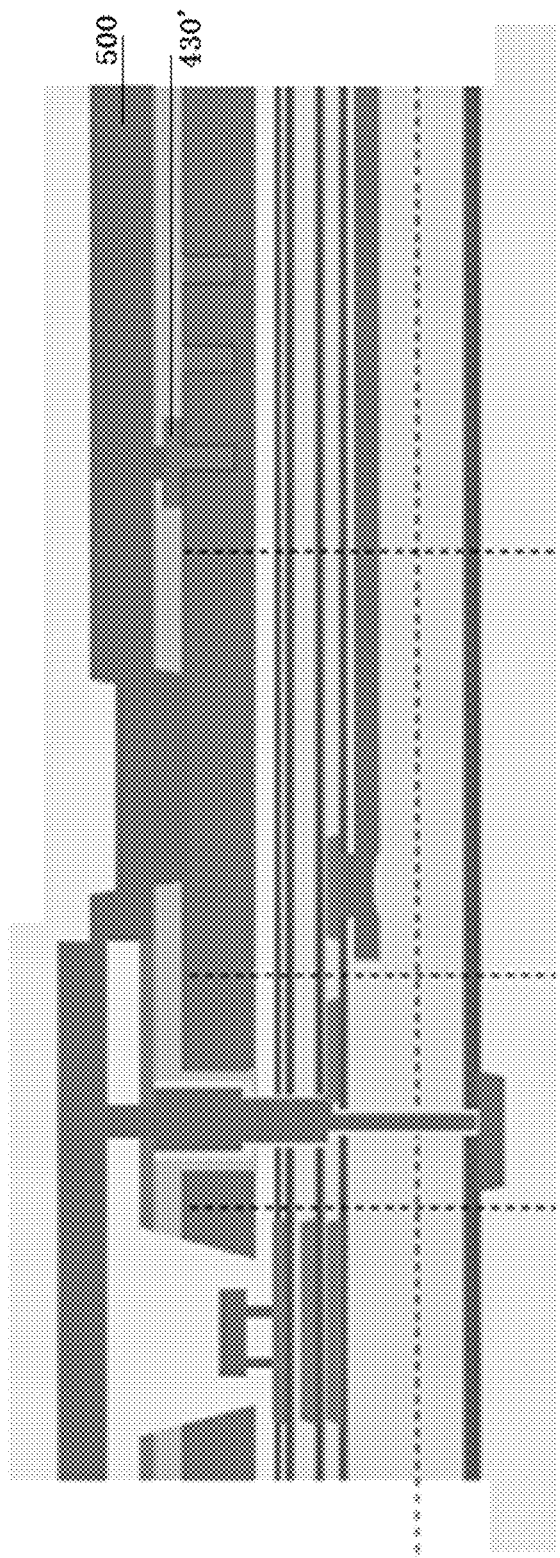

Finally, as shown in FIG. 10, in the subsequent process, a metal lead layer 500 is formed over the silicon epitaxial layer, so that semiconductor elements in the stack layer 100 can realize respective functions. Understandably, because the deep trench isolation grid structure 300 in the prior art does not include a metal layer, the metal lead layer 500 in the prior art as shown in FIG. 3 does not need to be connected to the deep trench isolation grid structure 300. Because the deep trench isolation grid structure 400 formed by the manufacturing method of the present disclosure includes a metal aluminum layer 430, as shown in FIG. 10, the metal lead layer 500 is connected to the entire metal aluminum layer 430 via the metal aluminum layer 430' as pins, the metal aluminum layer 430 is grounded and connected with an external negative voltage in the subsequent process, and the adjacent grids can form a stable potential difference under the external voltage to block electrical crosstalk.

So far, the method for manufacturing deep trench isolation grids according to one aspect of the present disclosure is already described. The deep trench isolation grid structure formed by the manufacturing method according to one aspect of the present disclosure has multiple isolation layers, and the multiple isolation layers include a metal layer that can be connected with an external voltage, so that a potential barrier can be actively formed to block electrical crosstalk. Further, the manufacturing method provided by the present disclosure can directly form the metal layer among the multiple isolation layers by a simple process flow, which can be connected to the subsequent metal lead layer, so that the process complexity is not increased.

The present disclosure further provides a pixel structure of a CMOS image sensor, the pixel structure including a photodiode and a deep trench isolation grid structure over the photodiode, wherein the deep trench isolation grid structure is manufactured by any of the embodiments of the manufacturing method described above.

Another embodiment of the present disclosure provides a CMOS image sensor, wherein the CMOS image sensor includes the pixel structure of the CMOS image sensor as described above.

Because the CMOS image sensor and its pixel structure provided by another aspect of the present disclosure have the deep trench isolation grid structure formed according to one aspect of the present disclosure, the electrical crosstalk between the photosensitive elements thereof is effectively reduced, which can effectively improve the device performance of the CMOS image sensor and its pixel structure.

Therefore, the embodiments of the method for manufacturing a deep trench isolation grid structure and the device structure formed are already described. Although the present disclosure is described with respect to specific exemplary embodiments, it would be apparent that various modifications and changes can be made to these embodiments without departing from the broader spirit and scope of the present disclosure. Therefore, this description and the accompanying drawings are considered to be illustrative but not restrictive.

It should be understood that this description would not be used to explain or limit the scope or significance of the claims. Moreover, in the foregoing detailed description, it can be seen that various features are combined together in a single embodiment for the purpose of simplifying the present disclosure. The method of the present disclosure should not be construed as reflecting the claimed embodiments require more features than those specifically listed in each claim. Conversely, as reflected in the appended claims, the creative subject matters are fewer than all features of a single embodiment disclosed. Accordingly, the appended claims are hereby incorporated in detailed descriptions, and each claim serves as an individual embodiment.

One embodiment or other embodiments mentioned in this description are intended to include at least one circuit or method in conjunction with the specific features, structures, or characteristics described in the embodiment(s). The phrase "an embodiment" that appears everywhere in the description does not necessarily refer to the same embodiment.

What is claimed is:

1. A method for manufacturing a deep trench isolation grid structure, comprising:
   providing a stack layer, wherein a top of the stack layer is a silicon epitaxial layer;
   forming a plurality of deep trenches in a grid shape in the silicon epitaxial layer;

depositing a first isolation layer and a second isolation layer sequentially on side walls and a bottom surface of each of the plurality of deep trenches;

depositing a third isolation layer on an upper surface of the second isolation layer, wherein the third isolation layer comprises a third isolation material layer that fills each of the plurality of deep trenches, and wherein the first isolation layer, the second isolation layer, and the third isolation layer together constitute the grid; and performing a bias etching back on the third isolation material layer, wherein the third isolation material layer in an open region outside the deep trenches at an edge of the grid is retained on the upper surface of the second isolation layer during the bias etching back for use as an external voltage connection, and wherein the third isolation material layer inside each of the plurality of deep trenches is retained during the bias etching back as the third isolation layer.

2. The method according to claim 1, wherein the first isolation layer is deposited on an upper surface of the silicon epitaxial layer and the second isolation layer is deposited on the first isolation layer, and wherein the third isolation material layer covers the second isolation layer formed on the upper surface of the silicon epitaxial layer.

3. The method according to claim 2, wherein the second isolation layer serves as an etch stop layer for the bias etching back.

4. The method according to claim 2, wherein a thickness of the third isolation material layer on the second isolation layer formed on the upper surface of the silicon epitaxial layer is in a range of 200 to 300 angstroms.

5. The method according to claim 1, further comprising:
before the forming the plurality of deep trenches, forming an alignment mark for the bias etching on the upper surface of the silicon epitaxial layer, wherein the alignment mark helps with the bias etching back by marking out the third isolation material layer in the open region outside of the deep trenches at the edge of the grid for the use of the external voltage connection.

6. The method according to claim 1,
wherein the third isolation layer is connected with an external voltage via the third isolation material layer retained in the open region outside of the deep trenches at the edge of the grid.

7. The method according to claim 1, wherein the third isolation layer comprises a metal layer; and wherein the method further comprises:
forming a metal lead layer connected to the third isolation layer over the stack layer, so that the third isolation layer is connected with an external voltage.

8. The method according to claim 7, wherein the depositing the third isolation layer comprises:
depositing a metal pad layer comprising a titanium nitride material on the upper surface of the second isolation layer; and
depositing a metal aluminum layer on an upper surface of the metal pad layer.

9. The method according to claim 1, wherein the first isolation layer comprises a high dielectric-constant film.

10. The method according to claim 1, wherein the second isolation layer comprise a silicon oxide film formed by a plasma enhanced atomic layer deposition process.

11. The method according to claim 10, wherein a thickness of the silicon oxide film is in a range of 250 to 270 angstroms.

12. The method according to claim 1, wherein the plurality of deep trenches has a shape of a rectangle or an inverted trapezoid.

13. The method according to claim 1, wherein the stack layer further comprises a photodiode layer under the silicon epitaxial layer.

14. A pixel structure of a CMOS image sensor, wherein the pixel structure comprises a photodiode and a deep trench isolation grid structure over the photodiode, wherein the deep trench isolation grid structure is manufactured by the method according to claim 1.

15. A CMOS image sensor, wherein the CMOS image sensor comprises the pixel structure of the CMOS image sensor according to claim 14.

* * * * *